(12) United States Patent
Son et al.

(10) Patent No.: US 12,398,455 B1
(45) Date of Patent: Aug. 26, 2025

(54) HIGH-RESISTIVITY RUTHENIUM OXIDE THIN FILM FABRICATION AND TEMPERATURE SENSOR STRUCTURE WITH HIGH-RESISTIVITY RUTHENIUM OXIDE THIN FILM

(71) Applicant: HRL Laboratories, LLC, Malibu, CA (US)

(72) Inventors: Kyung-Ah Son, Moorpark, CA (US); Pamela R. Patterson, Los Angeles, CA (US); Hwa Chang Seo, Torrance, CA (US); Jack A. Crowell, Camarillo, CA (US); Joshua M. Doria, Moorpark, CA (US); Mariano J. Taboada, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 18/421,782

(22) Filed: Jan. 24, 2024

(51) Int. Cl.
| | |
|---|---|
| *C23C 14/08* | (2006.01) |
| *C23C 14/34* | (2006.01) |
| *C23C 14/58* | (2006.01) |
| *G01K 7/02* | (2021.01) |

(52) U.S. Cl.
CPC .......... *C23C 14/08* (2013.01); *C23C 14/3407* (2013.01); *C23C 14/5806* (2013.01); *G01K 7/02* (2013.01)

(58) Field of Classification Search
CPC . C23C 14/08; C23C 14/3407; C23C 14/5806; G01K 7/02; G01K 7/16
See application file for complete search history.

(56) References Cited

U.S. PATENT DOCUMENTS 5,251,981 A * 10/1993 Kreider ............... H10N 10/817
  136/238
2023/0275151 A1 * 8/2023 Sharma ............... H01L 29/08
  257/288

OTHER PUBLICATIONS

S.A. Myers et al., "A Ruthenium Oxide Thermometer for Dilution Refrigerators Operating Down to 5 mK," Cryogenics, vol. 119; Oct. 2021; 18 pp.; https://doi.org/10.1016/j.cryogenics.2021.103367.
Y. Li et al., "Thin Film Resistance Thermometer with Simple Package for Cryogenic Application," Cryogenics, vol. 105; 2020; 5 pp.; https://doi.org/10.1016/j.cryogenics.2019.102997.

(Continued)

*Primary Examiner* — Charles S Bushey
(74) *Attorney, Agent, or Firm* — Wheatstone IP Law Corporation; Milad G. Shara (57) ABSTRACT

A high-resistivity N-doped ruthenium oxide thin film is formed on a substrate by flowing argon and nitrogen gases in a sputter chamber that includes a preconditioned ruthenium oxide sputter target. The method includes forming a plasma and sputter depositing a high-resistivity N-doped ruthenium oxide thin film with a N/Ru atomic ratio between 0.5 and 3.0 and resistivity greater than 0.01 Ω cm on the substrate in the substrate. A high-resistivity H-doped ruthenium oxide thin film is formed on a substrate by first forming an oxygen-rich ruthenium oxide thin film, followed by a hydrogen anneal. A temperature sensor structure includes a high-resistivity ruthenium oxide thin film that is doped with nitrogen or hydrogen and has a resistivity between 0.01 and 1 Ω cm.

9 Claims, 5 Drawing Sheets

(56) References Cited

OTHER PUBLICATIONS

S.S. Courts et al., "A Commerical Ruthenium Oxide Thermometer for Use to 20 Millikelvin," AIP Conference Proceedings, vol. 985; Mar. 27, 2008; pp. 947-954; https://doi.org/10.1063/1.2908694.
J.H. Huang et al., "Material Characteristics and Electrical Property of Reactively Sputtered RuO2 Thin Films," Thin Solid Films, vol. 382; Feb. 2001; pp. 139-145; https://doi.org/10.1016/S0040-6090(00)01777-6.
Y. Matsui et al., "Hydrogen Reduction of a RuO2 Electrode Prepared by DC Reactive Sputtering," Journal of Materials Science, vol. 35; 2000; pp. 4093-4098.

* cited by examiner

FIG. 5B

HIGH-RESISTIVITY RUTHENIUM OXIDE THIN FILM FABRICATION AND TEMPERATURE SENSOR STRUCTURE WITH HIGH-RESISTIVITY RUTHENIUM OXIDE THIN FILM

STATEMENT REGARDING FEDERAL FUNDING

This invention was made under U.S. Government contract. The U.S. Government has certain rights in this invention.

TECHNICAL FIELD

This specification relates to high-resistivity ruthenium oxide thin film fabrication and a temperature sensor structure that utilizes high-resistivity ruthenium oxide.

BACKGROUND

High-resistivity ruthenium oxides are conventionally prepared from ruthenium oxide pastes or inks using ruthenium nanoparticles. However, ruthenium oxide pastes or inks have various limitations in sensor fabrication and packaging, as discussed in "*Thin film resistance thermometer with simple package for cryogenic application*", Y. Li, F. Wang, M. You, Z. Lin, J. Liu, Cryogenics, 105, 102997 (2020), "*A ruthenium oxide thermometer for dilution refrigerators operating down to 5 mK*", S. A. Myers, H. Li, G. A. Csathy, Cryogenics, 119, 103367 (2021), and "*Commercial ruthenium oxide thermometer for use to 20 millikelvin*", S. S. Courts and J. K. Krause, AIP Conference Proceedings, 985, 947 (2008). Such methods are not compatible with conventional microdevice fabrication processes.

Hydrogenation or hydrogen-doping of conventional ruthenium oxide (e.g., $RuO_2$) films results in the reduction of the ruthenium oxide, generating low-resistivity oxygen-deficient ruthenium oxides ($RuO_{2-x}$) and metallic Ru, which evaporates from the substrate, as described in "*Hydrogen reduction of a $RuO_2$ electrode prepared by DC reactive sputtering*", Y. Matsui, M. Hiratani, and S. Kimura, Journal of Materials Science 35, 4093 (2000). This often leads to the delamination of the ruthenium oxide films.

Conventional ruthenium oxide $RuO_2$ is an electrically conductive transition metal oxide with an electrical resistivity of ~35 $\mu\Omega$ cm for bulk single crystals and ~110 $\mu\Omega$ cm for thin films, as described in "*Material characteristics and electrical property of reactively sputtered RuO2 thin films*", J. H. Huang, J. S. Chen, Thin Solid Films, 382, 139 (2001). Ruthenium oxide thin films reported to date are electrically conductive with low resistivity of $\rho < 0.001$ $\Omega$ cm, typically.

DESCRIPTION OF DRAWINGS

The as-deposited film was deposited by RF sputtering with flowing argon and oxygen from a preconditioned $RuO_2$ target.

DETAILED DESCRIPTION

According to an aspect, the disclosed embodiments illustrate methods of forming a high-resistivity N-doped ruthenium oxide thin film or a high-resistivity H-doped ruthenium oxide thin film. The high-resistivity N-doped ruthenium oxide thin film fabrication includes nitrogen doping in situ during sputter deposition to form a N/Ru atomic ratio in the range of 0.5 to 3.0 and resistivity greater than 0.01 $\Omega$ cm on a substrate. The high-resistivity H-doped ruthenium oxide fabrication includes formation of an oxygen-rich ruthenium oxide thin film followed by post-deposition hydrogen annealing to yield a resistivity greater than 0.01 $\Omega$ cm on a substrate.

According to another aspect, the disclosed embodiments illustrate a temperature sensor structure that utilizes a high-resistivity ruthenium oxide thin film fabricated directly on a substrate having a microelectronic component, e.g., a transistor, and BEOL metal and insulator structures. Monolithic fabrication of the high-resistivity ruthenium oxide thin film above the microelectronic circuitry enables temperature to be determined by the temperature-sensitive resistance of the ruthenium oxide.

The high-resistivity, N- or H-doped, ruthenium oxide fabrication methods support reliable, reproducible, repeatable methods to fabricate high-resistivity ruthenium oxide thin films suitable for integration on various substrates (rigid or flexible) and compatible with conventional microdevice fabrication processes, e.g., silicon FEOL (front end of line) and BEOL (back end of line) processes. The fabricated high-resistivity, N- or H-doped, ruthenium oxide films may be used to support (a) high-performance ultra-low temperature (<50 mK) sensors that are monolithically integrated with the samples, devices, or systems, of which temperature is to be monitored and (b) advancement of quantum technologies such as quantum computing, quantum information, and quantum sensing.

Figure 1:
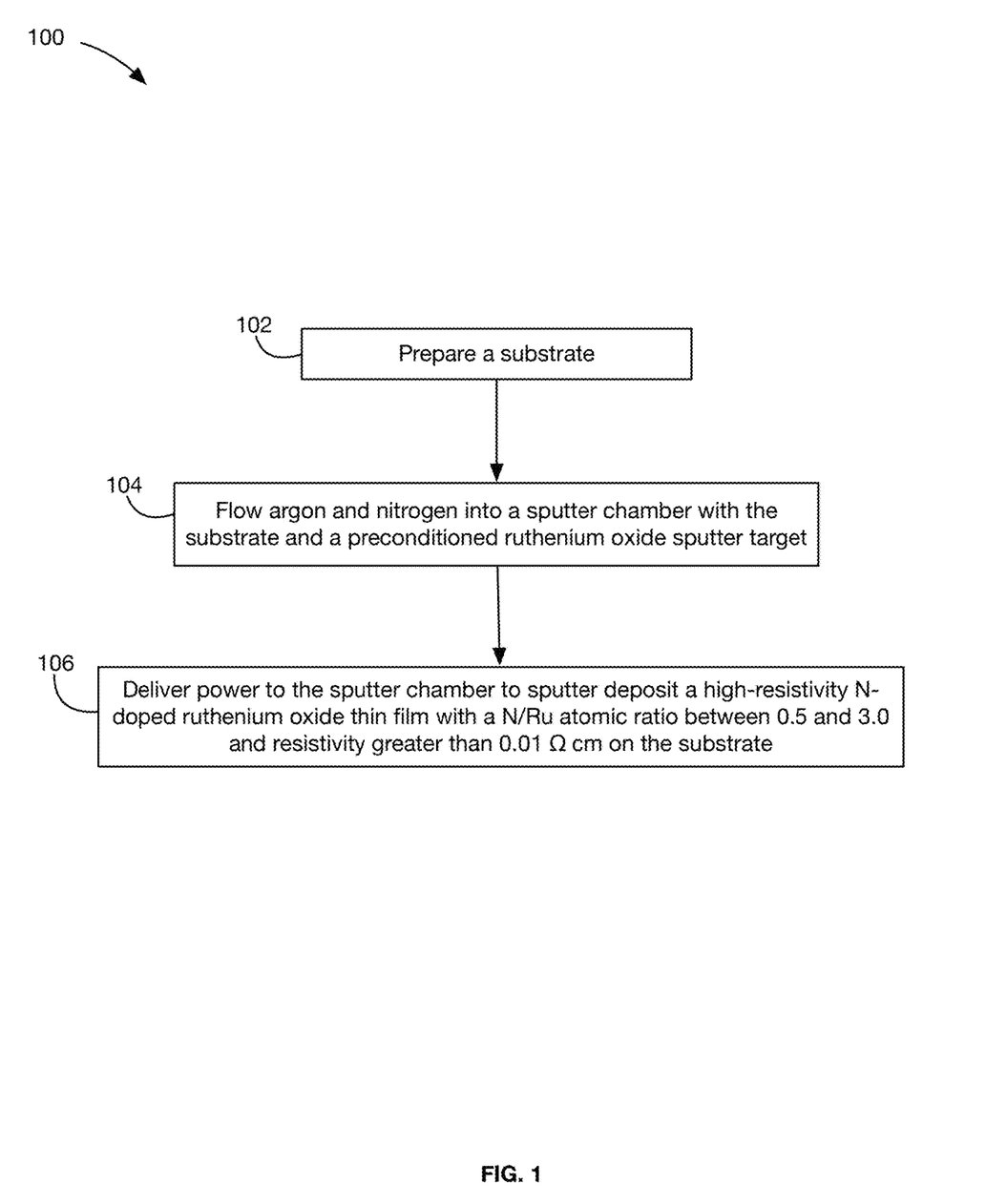
FIG. 1 shows steps in a method for forming a high-resistivity N-doped ruthenium oxide thin film.

FIG. 1 illustrates an embodiment of a method 100 for forming a high-resistivity N-doped ruthenium oxide thin film on a substrate in a sputter chamber. In step 102, a substrate is prepared that will subsequently have the high-resistivity N-doped ruthenium oxide thin film deposited upon. The substrate may include semiconducting, conducting, and/or insulating materials. For device/sensor applications, the semiconducting or electrically conducting substrate needs to be passivated with an electrically insulating thin film prior to deposition of the high-resistivity N-doped ruthenium oxide thin film. In an embodiment, the substrate can have a portion that is a semiconducting wafer such as silicon. In some embodiments, the substrate may include one or more transistors. In further embodiments, back end of line (BEOL) processing is performed after one or more transistors are formed. In embodiments, a clean of the substrate will include one or more sequential aqueous solution(s) of hydrochloric acid, ammonium hydroxide, hydrogen peroxide, ozone, or some combination thereof.

Following step 102, pre-sputter step 104 is performed. In the pre-sputter step 104, argon and nitrogen gases are flowed into a sputter chamber with the substrate and a preconditioned ruthenium oxide sputter target. The substrate may be placed into a load lock and pumped down to vacuum prior to being transported to the sputter chamber that is already under vacuum. Typical vacuum conditions during or following loading of the substrate are about $5 \times 10^{-6}$ Torr or below. After loading the substrate into the sputter chamber, in an embodiment, the argon flow rate is 25 sccm (standard cubic centimeters per minute) and the nitrogen flow rate is 1 to 12.5 sccm, which results in a nitrogen/argon flow rate ratio between 0.04 and 0.4. The sputter chamber is connected to a pump while the gas is flowing, with a pressure control valve (PCV) between the pump and the sputter chamber used to control the pressure. In embodiments, the pressure is in the range of 2 and 20 m Torr.

In the pre-sputter step 104, the material for the ruthenium oxide sputter target may be $RuO_2$. An unconditioned ruthenium oxide sputter target may contain surface contaminants from the air/environments or a poisoned skin layer formed during a previous deposition process that inhibits a high quality deposition of the intended material. To eliminate the contaminated or poisoned skin, the ruthenium oxide target is preconditioned by sputtering the target using, for example, an Ar plasma formed by delivering radio frequency (RF) power to the chamber while flowing argon gas. This process is performed until the poisoned skin is removed. The preconditioning of the target may be performed before the substrate is delivered to the sputter chamber or may be performed right before the film deposition, after the substrate is delivered to the sputter chamber with an obstacle, e.g., a shutter, between the sputter target and substrate.

In step 106, radio frequency (RF) power is delivered to the sputter chamber to sputter deposit a high-resistivity N-doped ruthenium oxide thin film with a N/Ru atomic ratio in the range of 0.5 to 3.0 and resistivity greater than 0.01 Ω cm on the substrate. The delivered RF power may be in the range of 50 to 200 W and serves to strike a plasma in the vicinity of a sputter target. A magnetron may be used to better control the plasma. The plasma includes energetic Ar ions, N ions, and electrons. These energetic ions impinge upon the ruthenium oxide sputter target and abrade the ruthenium oxide material from the target, in a process known as sputtering. The ruthenium and oxygen, along with the nitrogen in the plasma, then deposit onto the substrate to form the high-resistivity N-doped ruthenium oxide thin film.

Figure 2:
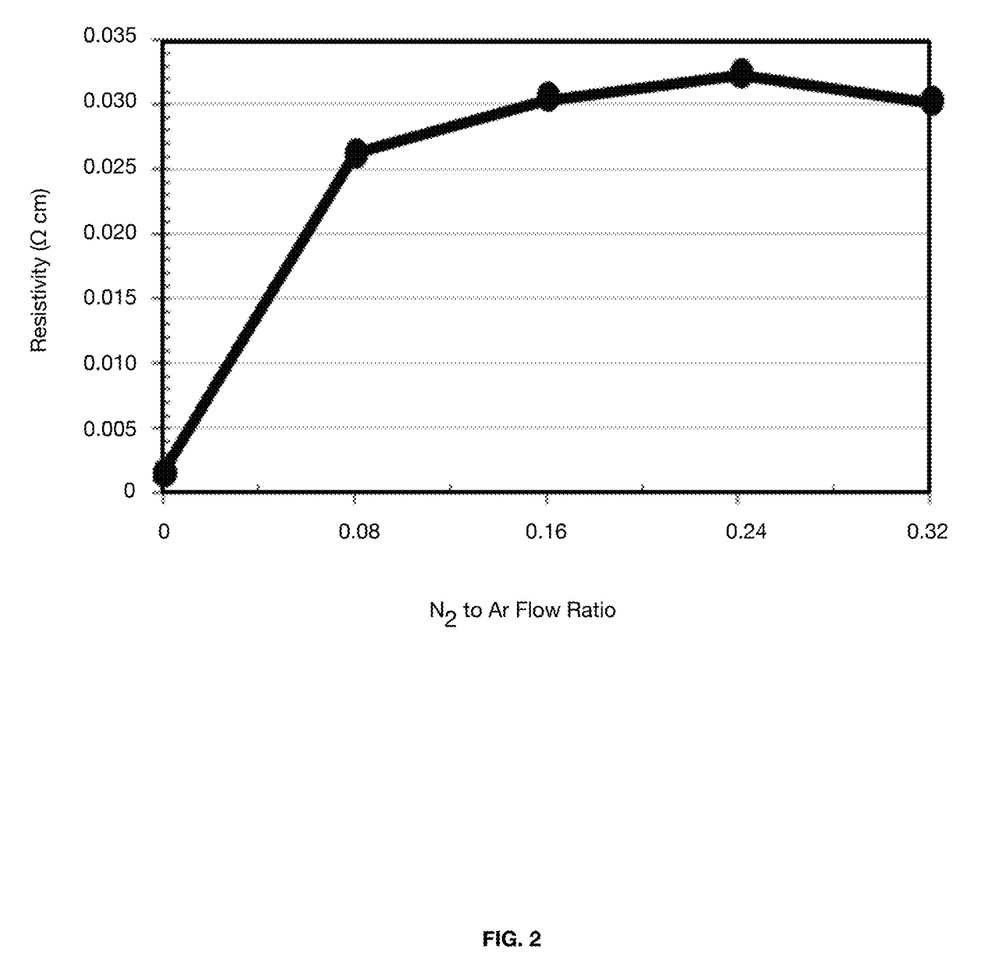
FIG. 2 shows electrical resistivity of ruthenium oxide thin films as a function of nitrogen/argon gas flow ratio for RF sputtering from a preconditioned $RuO_2$ sputter target.

FIG. 2 shows the electrical resistivity of ruthenium oxide thin films in embodiments that include the following deposition conditions: (a) RF magnetron sputtering at room temperature (~25° C.) from a $RuO_2$ target (b) Ar flow rate of 25 sccm; (c) nitrogen flow rates of 0, 2, 4, 6, and 8 sccm; and (d) deposition pressure of 10 mTorr. Data shows a significant increase in resistivity from 0.001 Ω cm with no nitrogen flow to a peak of 0.032 Ω cm at a nitrogen/argon flow ratio of 0.24. These data show that high-resistivity (>0.01 Ω (cm) ruthenium oxide thin films are achievable with nitrogen/argon flow ratios from about 0.04 to about 0.4. In embodiments, the high-resistivity N-doped ruthenium oxide film has a resistivity in the range of 0.02 to 0.1 Ω cm. The thin films in FIG. 2 ranged in thickness from about 80 nm to about 100 nm. The thickness may be increased by increasing the deposition time or decreased by reducing the deposition time. In embodiments, the high-resistivity N-doped ruthenium oxide thin film has a thickness between about 10 nm and 500 nm. X-ray diffraction data indicate that the thin films shown in FIG. 2 are amorphous.

Energy Dispersive X-ray Spectroscopy (EDS) demonstrates that the nitrogen flow results in nitrogen doping of the deposited thin film. For example, EDS shows a N/Ru atomic ratio of 1.59, a N/O atomic ratio of 0.49, and an O/Ru atomic ratio of 3.22 for a nitrogen/argon flow ratio of 0.24. Increasing the nitrogen/argon flow ratio to 0.32 increases the N incorporation to a N/Ru atomic ratio of 1.86 and a N/O atomic ratio of 0.57 while increasing the O/Ru atomic ratio slightly to 3.25. Modifying the flow rates and deposition conditions will result in different atomic ratios. The high-resistivity N-doped ruthenium oxide thin films have N/Ru atomic ratios in the range of 0.5 to 3, and in some embodiments in the range of 1.0 to 2.5. In embodiments, the N/O ratio is in the range of 0.3 to 0.7.

Figure 3:
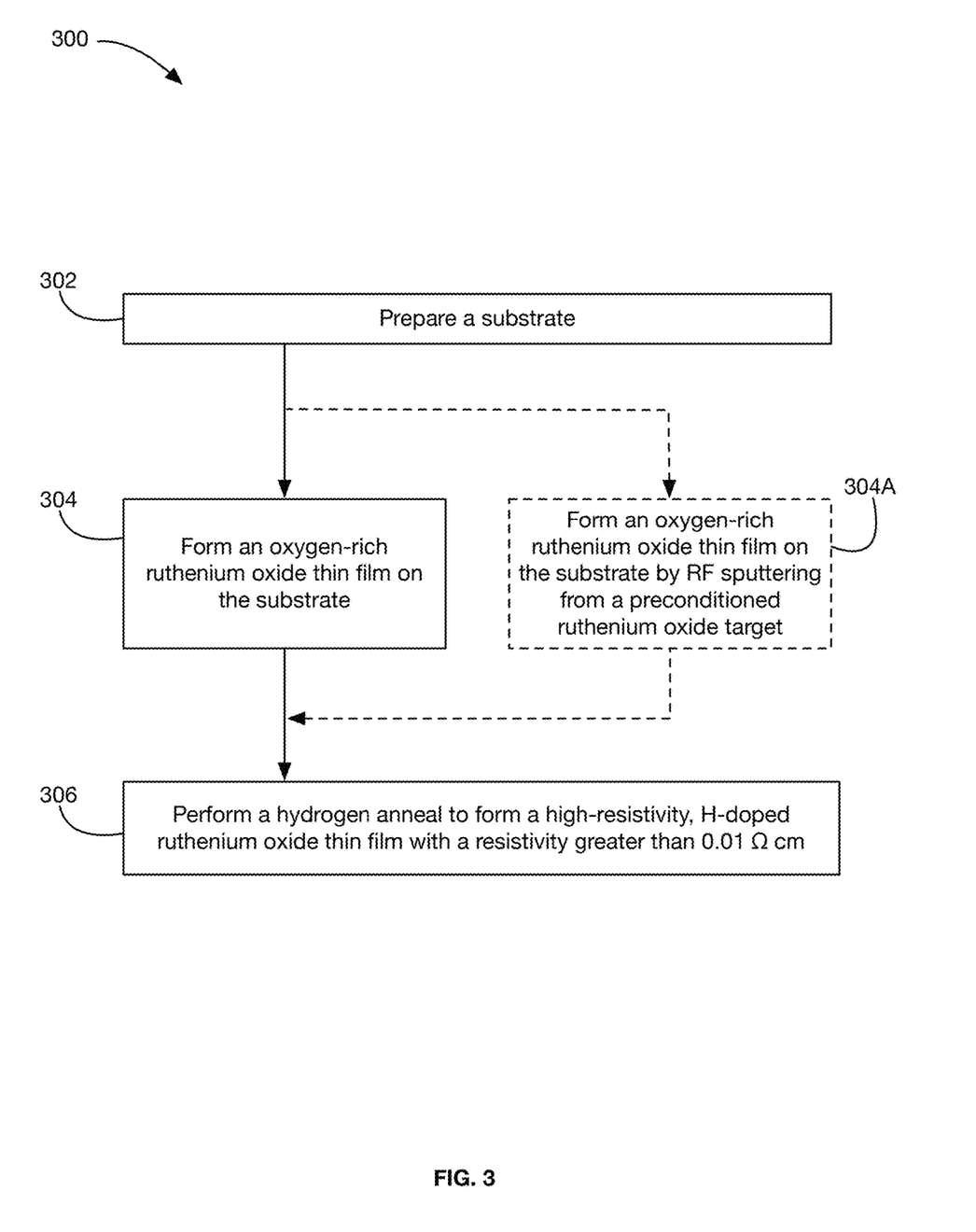
FIG. 3 shows steps in a method for forming a high-resistivity H-doped ruthenium oxide thin film.

FIG. 3 illustrates an embodiment of a method 300 for forming a high-resistivity H-doped ruthenium oxide thin film on a substrate. In step 302, a substrate is prepared that will subsequently have the high-resistivity H-doped ruthenium oxide thin film deposited upon. The step 302 is similar to the step 102 of method 100 in FIG. 1.

In step 304, an oxygen-rich ruthenium oxide thin film, different from a conventional stoichiometric ruthenium oxide thin film, is formed on the substrate. Oxygen-rich is with respect to stoichiometric $RuO_2$; that is, having an O/Ru atomic ratio greater than 2. The method for the growth of the oxygen-rich ruthenium oxide thin film may include physical vapor deposition (PVD) also known as sputtering, chemical vapor deposition (CVD), and atomic layer deposition (ALD). In an embodiment, step 304 may be performed as step 304A where the oxygen-rich ruthenium oxide thin film is deposited on the substrate by RF sputtering from a preconditioned ruthenium oxide target. The preconditioning of the ruthenium oxide target may include a pre-sputter of the target using an argon and oxygen plasma to remove contaminants and/or poison skin on the sputter target. Such preconditioning with an argon and oxygen plasma may serve to make the surface of the sputter target oxygen-rich. The RF sputter deposition process may use argon gas mixed with oxygen gas, with an argon/oxygen flow rate ratio in the range of 1.5 to 5. In embodiments, the pressure during the sputter deposition is controlled in the range of 2 and 20 mTorr. The RF power during the sputter deposition may be in the range of 50 to 200 W.

In step 306, a hydrogen anneal is performed on the oxygen-rich ruthenium oxide thin film to form a high-resistivity H-doped ruthenium oxide thin film with a resistivity greater than 0.01 Ω cm. The hydrogen anneal may flow hydrogen, a mixture of hydrogen and nitrogen, or a mixture of hydrogen and argon where the hydrogen percentage is in the range of 5 to 100%. The hydrogen anneal creates a reducing environment that reduces the amount of oxygen in the film.

Figure 4:
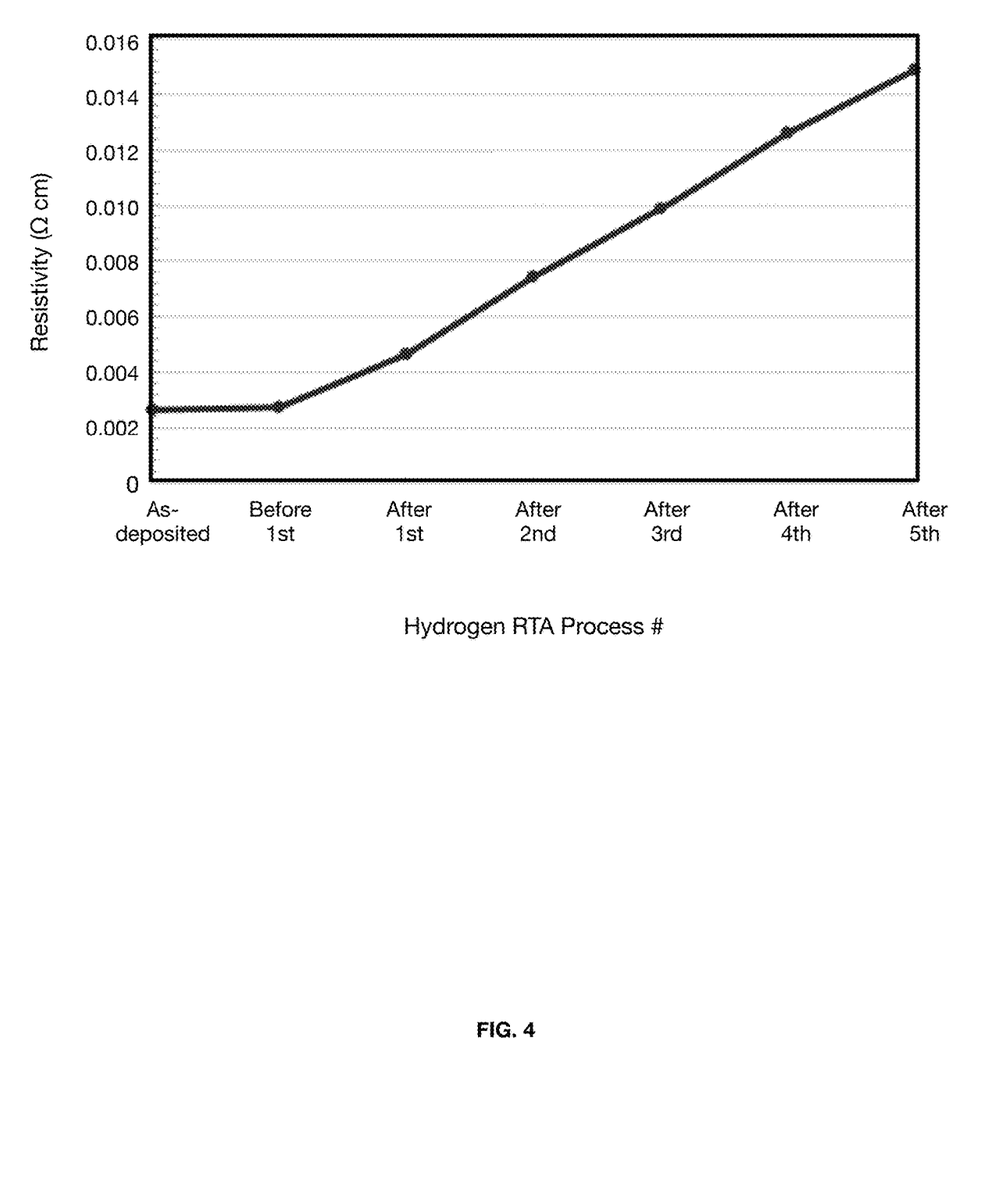
FIG. 4 shows electrical resistivity of a ruthenium oxide thin film before and after sequential Rapid Thermal Anneals in a hydrogen environment (HRTA) where each HRTA is performed at 100° C. for 5 min each at a pressure of 1 atm under conditions of flowing forming gas (10% $H_2$, 90% $N_2$).

FIG. 4 shows electrical resistivity for an as-deposited oxygen-rich ruthenium oxide thin film and after sequential hydrogen anneals in embodiments that include the following deposition conditions: (a) RF magnetron sputtering at room temperature (~25° C.) from a preconditioned $RuO_2$ target; (b) Ar and oxygen flow rates respectively of 25 and 12 sccm; and (c) deposition pressure of 10 mTorr. Data shows a low, as-deposited resistivity of about 0.0025 Ω cm. Five sequential hydrogen rapid thermal anneals (HRTA) performed at 100° C. for 5 min each at a pressure of 1 atm under conditions of flowing forming gas (10% $H_2$, 90% $N_2$), with the resistivity measured after each HRTA. As can be seen, each sequential HRTA increased the resistivity. After the 5th anneal (25 minutes total), the resistivity is measured to be 0.0152 Ω cm. From the trend in FIG. 4, it is apparent that longer and/or hotter anneal anneals may increase the resistivity further. In embodiments, the hydrogen anneal will be performed at temperatures in the range of 100° C. to 200° C. Anneal times will range from 30 s to 1 hour, with higher anneal temperatures typically allowing shorter anneal times. In embodiments, the high-resistivity H-doped ruthenium oxide film has a resistivity in the range of 0.015 to 0.1 Ω cm. The thin film in FIG. 4 had a thickness of about 40 nm. The thickness may be increased by increasing the deposition time or decreased by reducing the deposition time. In embodiments, the high-resistivity H-doped ruthenium oxide thin film has a thickness in the range of 10 nm to 500 nm. X-ray diffraction data indicate that the as-deposited oxygen-rich ruthenium oxide thin film shown in FIG. 4 is crystalline and remains crystalline after the 5th HRTA.

Energy Dispersive X-ray Spectroscopy (EDS) demonstrates that the hydrogen anneal reduces the oxygen in the ruthenium oxide thin film. For example, EDS shows an O/Ru atomic ratio of 4.84 in the as-deposit film shown in FIG. 4, which is reduced to an O/Ru atomic ratio of 4.80 after the $5^{th}$ HRTA. The stoichiometric O/Ru for $RuO_2$ is 2. Modifying the sputter deposition conditions and anneal conditions will result in somewhat different atomic ratios. In embodiments, the high-resistivity H-doped ruthenium oxide thin film has an O/Ru atomic ratio in the range of 2.01 to 4.82.

Figure 5A:
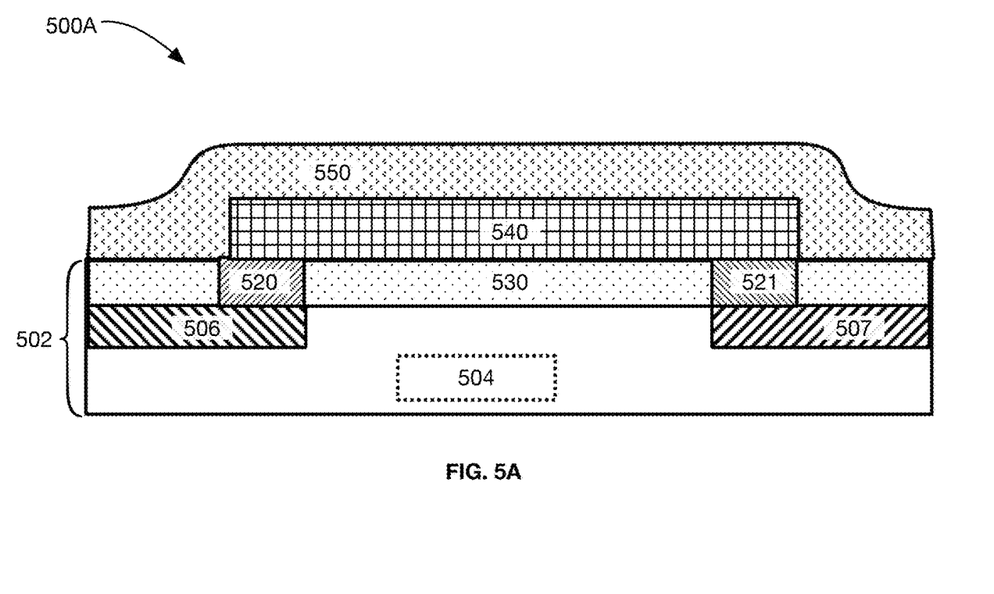
FIG. 5A shows a cross sectional view of temperature sensor structure with a high-resistivity ruthenium oxide thin film according to an embodiment.
Figure 5B:
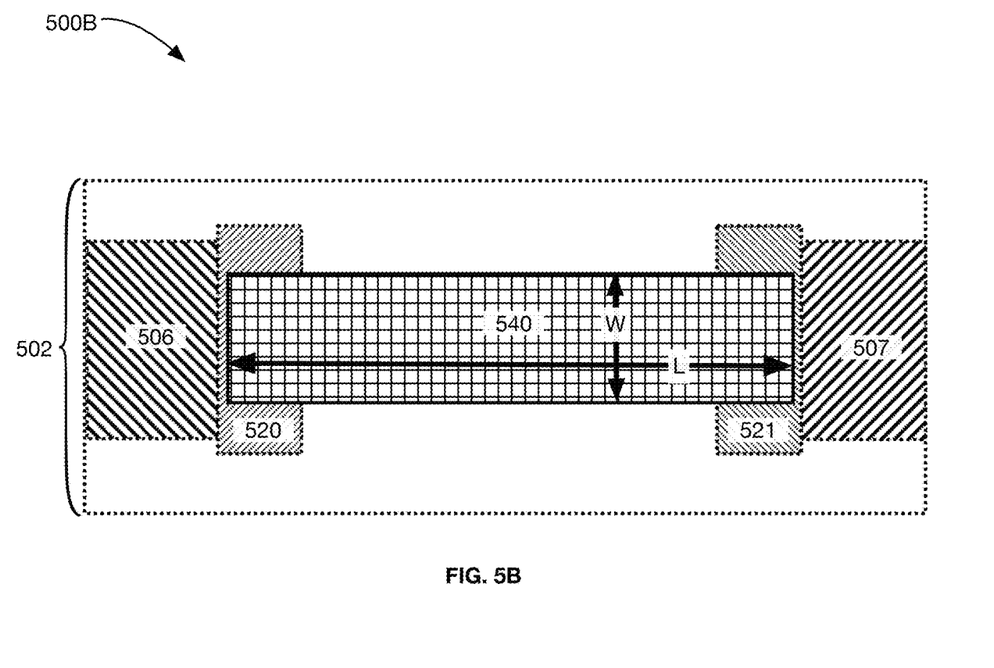
FIG. 5B shows a top view of the temperature sensor structure in FIG. 5A.

FIGS. 5A and 5B show respectively a cross section 500A and a top view 500B of a structure for a temperature sensor that uses a high-resistivity ruthenium oxide thin film as the temperature sensing element. The resistance of the high-resistivity ruthenium oxide thin film changes with temperature and this variation in resistance is detected and used to determine the temperature. In an embodiment, the temperature sensor is a cryogenic temperature sensor.

Referring to FIG. 5A, the temperature sensor includes a substrate 502. The substrate 502 may include the elements of the substrate described in step 102 of FIG. 1 or step 302 of FIG. 3. For the temperature sensor, the substrate further includes a transistor 504 and may include a circuit with many transistors for providing current to and for measuring voltage across the high-resistivity ruthenium oxide thin film. Above the transistor are the contacts to the transistor, the conductive vias, the metal lines and the insulators between the conductive features. These portions of the substrate above the transistor are typically referred to as the back end of line (BEOL). In the substrate 502 above the transistor 504 is a first BEOL metal line 506 and a second BEOL metal line 507. The first BEOL metal line 506 and second BEOL metal line 507 will generally be connected to other lines and circuit elements that are not explicitly shown in FIG. 5A. In an embodiment, the BEOL metal lines 506 and 507 are coplanar. Above the plane of the BEOL metal lines 506 and 507 is a first metallic pathway 520, a second metallic pathway 521, and an isolating dielectric 530. The methods for manufacturing a substrate with the required elements are well known to those skilled in the art and will not be repeated here.

Directly above the substrate 502 is a high-resistivity ruthenium oxide thin film 540. This thin film 540 has a resistivity in the range of 0.01 to 1 Ω cm and is either N-doped or H-doped. The high-resistivity ruthenium oxide thin film 540 may be formed using the methods discussed earlier or by other means. The high-resistivity ruthenium oxide thin film 540 will be patterned so that it is on only a portion of the substrate. Patterning techniques may include (1) deposition of the film, followed by lithography and etch, (2) a damascene process including formation of a patterned dielectric layer with an opening, deposition of the film on the dielectric layer and in the opening, and chemical mechanical polishing (CMP) to remove the film on the dielectric layer, or (3) a liftoff process in which a negative tone photoresist is patterned with an opening, followed by film deposition on both the photoresist and the opening, followed by dissolution of the photoresist to remove the film on the photoresist. Above the high-resistivity ruthenium oxide thin film 540 is a capping dielectric 550 that may serve to insulate and protect the temperature sensor. The capping dielectric 550 may be a dielectric comprising silicon oxide, silicon nitride, silicon oxynitride, aluminum oxide, aluminum nitride, or some combination thereof. The capping dielectric 550 may be deposited by CVD, ALD, or by a spin-on technique.

The first metallic pathway 520 electrically connects a first portion of the high-resistivity ruthenium oxide thin film 540 to the first BEOL metal line 506. Likewise, the second metallic pathway 521 electrically connects a second portion of the high-resistivity ruthenium oxide thin film 540 to the second BEOL metal line 507. The first and second metallic pathways 520 and 521 are coplanar and may be vias or lines. These metallic pathways serve to electrically connect the temperature sensing element (the high-resistivity ruthenium oxide thin film 540) to the substrate 502.

As shown in FIG. 5A, the isolating dielectric 530 is located below at least a portion of the high-resistivity ruthenium oxide thin film 540. This allows the isolating dielectric 530 to electrically isolate the high-resistivity ruthenium oxide thin film from substrate 502 portions other than the first metallic pathway 520 and the second metallic pathway 521.

At least a portion of the isolating dielectric 530 is located between the first metallic pathway 520 and the second metallic pathway 521. This prevents direct electrical shorting between the two metallic pathways. In embodiments, the thickness of the high-resistivity ruthenium oxide thin film is in the range of 10 to 500 nm. The O/Ru atomic ratio in the high-resistivity ruthenium oxide thin film may be in the range of 2.01 to 4.82. For cases in which the high-resistivity ruthenium oxide thin film is N-doped, the phase may be amorphous. Additionally, the N/Ru atomic ratio may be in the range of 0.5 to 3 and the N/O atomic ratio may be in the range of 0.3 to 0.7. For cases in which the high-resistivity ruthenium oxide thin film is H-doped, the phase may be crystalline.

A top view of the temperature sensor structure is shown in FIG. 5B. For clarity, the transistor 504, isolating dielectric 530 and the capping dielectric 550 are not shown. As also shown in FIG. 5A, the substrate 502 includes a first BEOL metal line 506, a second BEOL metal line 507, a first metallic pathway 520, and a second metallic pathway 521. The two metallic pathways are above and in contact with the two BEOL metal lines. Above and in contact with the first metallic pathway 520 and the second metallic pathway 521 is the high-resistivity ruthenium oxide thin film 540. In an embodiment, the high-resistivity ruthenium oxide thin film is patterned in rectangular shape with a length L and a width W, where the L/W ratio may be 2 or greater. Other shapes, e.g. spiral or serpentine, may be used for the high-resistivity ruthenium oxide thin film.

As shown in FIG. 5B, the end portions of the high-resistivity ruthenium oxide thin film 540 may be electrically connected to the first and second metallic pathways 520 and 521 on opposite ends of the rectangular shape in the length L direction.

FIGS. 5A and 5B illustrate two electrical connections to the high-resistivity ruthenium oxide thin film 540, such as for a two point probe resistance measurement technique in an embodiment. Alternatively, two additional metallic pathways that contact the high-resistivity ruthenium oxide 540 in two additional locations may be used. Each of the additional metallic pathways will in turn be connected to its own BEOL metal line. This will enable a four-point probe technique, where, for example, two of the contacts are used to force a current and the other two are used to measure a voltage. The four-point probe technique eliminates contact resistance effects and may provide more accurate temperature sensing than a two-point probe technique.

A number of example embodiments have been described. Nevertheless, it will be understood that various modifications may be made without departing from the spirit and scope of the devices and methods described herein.

What is claimed is:

1. A temperature sensor structure comprising:
   a substrate comprising at least one transistor, a first back-end-of-line (BEOL) metal line, a second BEOL metal line, a first metallic pathway, a second metallic pathway, and an isolating dielectric;
   a high-resistivity ruthenium oxide thin film directly on the substrate; and
   a capping dielectric directly above the high-resistivity ruthenium oxide thin film;
   wherein:
   the resistivity of the high-resistivity ruthenium oxide thin film is in the range of 0.01 to 1 Ω cm;
   the high-resistivity ruthenium oxide thin film is doped with nitrogen and/or or hydrogen;
   the first metallic pathway connects a first portion of the high-resistivity ruthenium oxide thin film to the first BEOL metal line;
   the second metallic pathway connects a second portion of the high-resistivity ruthenium oxide thin film to the second BEOL metal line;
   the isolating dielectric is below at least a portion of the high-resistivity ruthenium oxide thin film; and
   at least a portion of the isolating dielectric is between the first metallic pathway and the second metallic pathway.

2. The structure of claim 1 wherein the thickness of the high-resistivity ruthenium oxide thin film is in the range of 10 to 500 nm.

3. The structure of claim 1 wherein the O/Ru atomic ratio in the high-resistivity ruthenium oxide thin film is in the range of 2.01 to 4.82.

4. The structure of claim 1 wherein the high-resistivity ruthenium oxide thin film is N-doped and the phase is amorphous.

5. The structure of claim 1 wherein the high-resistivity ruthenium oxide thin film is N-doped with a N/Ru atomic ratio in the range of 0.5 to 3.

6. The structure of claim 1 wherein high-resistivity ruthenium oxide thin film is N-doped with a N/O atomic ratio in the range of 0.3 to 0.7.

7. The structure of claim 1 wherein the high-resistivity ruthenium oxide thin film is H-doped and the phase is crystalline.

8. The structure of claim 1 wherein the high-resistivity ruthenium oxide thin film has a rectangular shape in a plan-view image with a length to width aspect ratio greater than or equal to 2.

9. The structure of claim 8 wherein the first portion of the high-resistivity ruthenium oxide thin film and the second portion of the high-resistivity ruthenium oxide thin film are on opposite ends of the rectangular shape in the length direction.

* * * * *